(12) United States Patent
Kagei

(10) Patent No.: US 11,774,512 B2
(45) Date of Patent: Oct. 3, 2023

(54) CELL EVALUATION METHOD AND CELL EVALUATION DEVICE

(71) Applicant: HONDA MOTOR CO., LTD., Tokyo (JP)

(72) Inventor: Yuta Kagei, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 122 days.

(21) Appl. No.: 17/601,437

(22) PCT Filed: Apr. 9, 2020

(86) PCT No.: PCT/JP2020/015927
§ 371 (c)(1),
(2) Date: Oct. 5, 2021

(87) PCT Pub. No.: WO2020/209325
PCT Pub. Date: Oct. 15, 2020

(65) Prior Publication Data
US 2022/0163593 A1     May 26, 2022

(30) Foreign Application Priority Data

Apr. 10, 2019   (JP) ................. 2019-074896

(51) Int. Cl.
*G01R 31/389*   (2019.01)
*H01M 10/48*    (2006.01)
*H01M 50/569*   (2021.01)

(52) U.S. Cl.
CPC .......... *G01R 31/389* (2019.01); *H01M 10/48* (2013.01); *H01M 50/569* (2021.01)

(58) Field of Classification Search
CPC ........ G01N 21/47; G01N 21/84; G01N 29/11; G01N 2291/048; H01M 10/4285; H01M 10/44; G01R 31/385; G01R 31/28
(Continued)

(56) References Cited

U.S. PATENT DOCUMENTS

2005/0253591 A1    11/2005   Kasamatsu et al.
2012/0114981 A1*    5/2012   Cho .................... H01M 50/574
                                                                429/8
(Continued)

FOREIGN PATENT DOCUMENTS

JP    2005327616 A    11/2005
JP    2009158266 A     7/2009
(Continued)

*Primary Examiner* — Lee E Rodak
*Assistant Examiner* — Trung Q Nguyen
(74) *Attorney, Agent, or Firm* — CKC & Partners Co., LLC

(57) ABSTRACT

The purpose of the present invention is to provide a cell evaluation method and a cell evaluation device that can more precisely estimate the condition of an internal short circuit, the method including: a puncture initiation step in which a metallic projection is moved at a predetermined speed in order to begin puncturing a test cell; a measurement initiation step for beginning to measure the voltage and the electrical resistance between a positive electrode terminal of the test cell and the metallic projection; and a first determination step in which, when the voltage becomes greater than a first threshold voltage V1 and the electrical resistance becomes lower than a first threshold resistance R1, the metallic projection is determined to have made contact with a negative electrode of the test cell. This cell evaluation device can be used directly in the implementation of this cell evaluation method.

8 Claims, 8 Drawing Sheets

(58) Field of Classification Search
USPC .......... 324/400, 430–437, 500, 600, 764.01,
324/103 R, 771, 761.01, 501, 639, 642,
324/702, 76.11, 76.66, 96
See application file for complete search history.

(56) References Cited

U.S. PATENT DOCUMENTS

2019/0162771 A1    5/2019  Miyazawa et al.
2019/0245210 A1*   8/2019  Matsushita ............. H01M 4/82

FOREIGN PATENT DOCUMENTS

| JP | 2010212183 A | 9/2010 |
| JP | 2014029823 A | 2/2014 |
| JP | 2015158442 A | 9/2015 |
| JP | 2019102169 A | 6/2019 |

* cited by examiner

CELL EVALUATION METHOD AND CELL EVALUATION DEVICE

TECHNICAL FIELD

The present invention relates to a cell evaluation method and a cell evaluation device.

BACKGROUND ART

In response to incidents involving the ignition of lithium-ion secondary batteries and batteries of other types, there are efforts underway to establish safety test methods and safety standards for ensuring the safety of the batteries. Patent Document 1 discloses a cell evaluation device in which "a short circuit detection unit 4 detects an internal short circuit in a test cell 1 subjected to nail penetration or crushed by means of a pressure applied by a pressurization unit 2; a pressurization control unit 3 stops operation of the pressurization unit 2 upon detection of a short circuit; and a cell information detection unit 6 collects and records cell information such as a cell temperature".

Patent Document 1: Japanese Unexamined Patent Application, Publication No. 2005-327616

DISCLOSURE OF THE INVENTION

Problems to be Solved by the Invention

The cell evaluation device of Patent Document 1 determines, by means of the short circuit detection unit 4, occurrence of an internal short circuit based on a change in a cell voltage of the test cell 1 subjected to nail penetration. However, in a case of a lithium-ion battery having a large capacity, it is difficult to highly accurately control a position that a penetrating nail reaches because a position that the nail has reached by penetration causes a gentle change in a battery voltage (cell voltage), and especially, an internal short circuit causes a gentle decrease in the battery voltage. For these reasons, it is impossible to accurately control the number of layers where an internal short circuit occurs, resulting in a large variation in test results.

An object of the present invention is to provide a cell evaluation method and a cell evaluation device that enable more accurate estimation of a state of an internal short circuit.

Means for Solving the Problems

The present inventor has achieved the present invention by developing a cell evaluation method for evaluating safety of a cell, the cell evaluation method including forcibly causing an internal short circuit in a test cell by way of penetration of a metal projection into the test cell, and detecting a change occurring in a state of the test cell due to the internal short circuit. The cell evaluation method includes: a penetration start step including moving the metal projection at a predetermined speed and starting penetration of the metal projection into the test cell; a measurement start step including starting measurement of a voltage and electric resistance between a positive electrode terminal of the test cell and the metal projection; and a first determination step including determining that the metal projection has come into contact with a negative electrode of the test cell when the voltage becomes higher than a first threshold voltage value V1 and the resistance becomes lower than a first threshold resistance value R1.

According to an embodiment of the present invention, the cell evaluation method further includes: after the first determination step, a second determination step including determining that the metal projection has come into contact with a positive electrode material mixture of the test cell when the voltage becomes lower than a second threshold voltage value V2 and the resistance becomes lower than a second threshold resistance value R2 and higher than a third threshold resistance value R3; and a third determination step including determining that the metal projection has come into contact with a positive electrode foil of the test cell when the voltage becomes lower than the second threshold voltage value V2 and the resistance becomes lower than the third threshold resistance value R3.

According to another embodiment of the present invention, the cell evaluation method further includes: after the first determination step, a third determination step including determining that the metal projection has come into contact with a positive electrode foil of the test cell when the voltage becomes lower than a second threshold voltage value V2 and the resistance becomes lower than a third threshold resistance value R3.

A yet another embodiment of the present invention is directed to a cell evaluation device for evaluating safety of a cell by forcibly causing an internal short circuit in a test cell by way of penetration of a metal projection into the test cell, and by detecting a change occurring in a state of the test cell due to the internal short circuit. The cell evaluation device includes: a drive device that moves the metal projection at a predetermined speed, and causes the metal projection to penetrate into the test cell; a measurement device that measures a voltage and electric resistance between a positive electrode terminal of the test cell and the metal projection; and a short circuit determination unit that determines that the metal projection has come into contact with a negative electrode of the test cell when the voltage becomes higher than a first threshold voltage value V1 and the resistance becomes lower than a first threshold resistance value R1.

Effects of the Invention

According to the present invention, while the metal projection is penetrating into the test cell, the voltage and the electric resistance between the positive electrode terminal of the test cell and the metal projection are measured, so that a position that the metal projection has reached by penetration is determined. Since changes occurring in the voltage and the electric resistance between the positive electrode terminal and the metal projection due to a position that the penetrating metal projection has reached by penetration are more noticeable than a change in a cell voltage, the position can be determined and controlled with high accuracy.

PREFERRED MODE FOR CARRYING OUT THE INVENTION

The present invention will be described by way of embodiments of the invention. The present invention relates to a cell evaluation method for evaluating safety of a cell, the cell evaluation method including forcibly causing an internal short circuit in a test cell by way of penetration of a nail into the test cell, and detecting a change occurring in a state of the test cell due to the internal short circuit.

Figure 1:
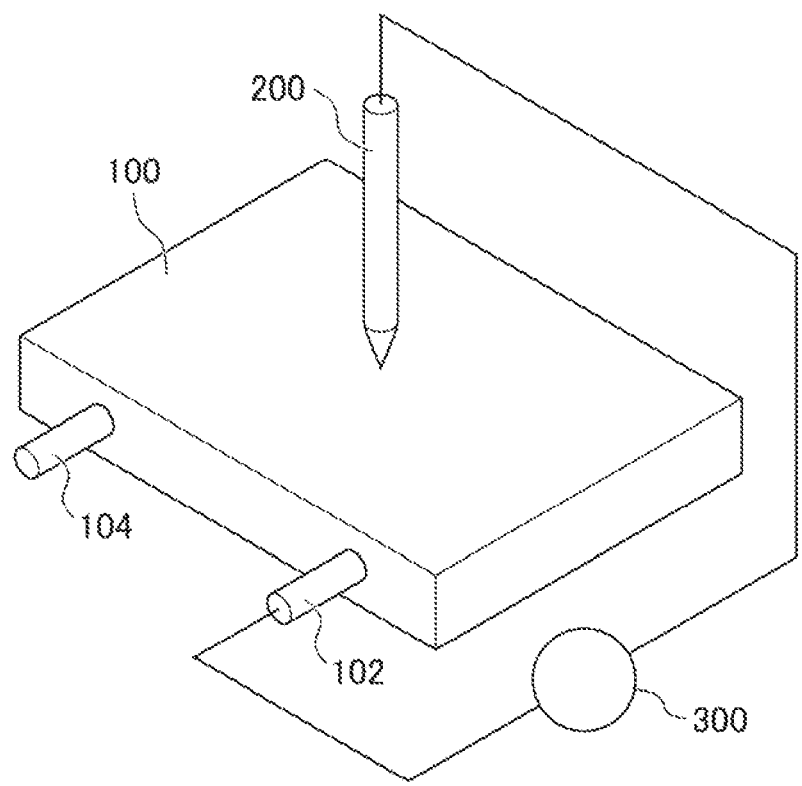
FIG. 1 is a diagram schematically illustrating a device used in an embodiment of the present invention.

FIG. 1 is a diagram schematically illustrating a device used in an embodiment of the present invention. In FIG. 1, a test cell 100 is an evaluation target of the cell evaluation method according to the present invention. The test cell 100 has a positive electrode terminal 102 and a negative electrode terminal 104. A nail 200 is to penetrate into the test cell 100 to forcibly cause an internal short circuit. The nail 200 is an example of a metal projection. The nail 200 is attached to, and driven by, a pressurization device so that the nail 200 can move at a predetermined speed to the test cell 100 and can be caused to penetrate into the test cell 100. A measurement device 300 measures a voltage between the positive electrode terminal 102 of the test cell 100 and the nail 200 (hereinafter also referred to as "positive electrode-nail voltage", and denoted by a reference character "Vcn") and AC electric resistance between the positive electrode terminal 102 and the nail 200 (hereinafter also referred to as "positive electrode-nail resistance" and denoted by a reference character "Rcn").

Figure 2:
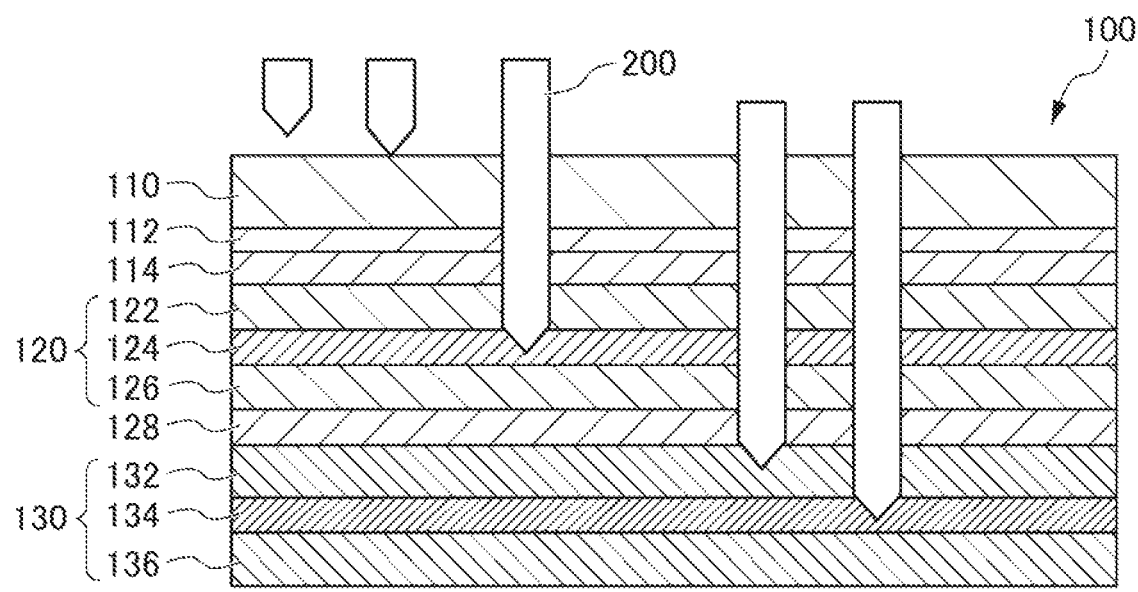
FIG. 2 is a diagram schematically illustrating stages of penetration of a nail into a cell in an embodiment of the present invention.

FIG. 2 is a diagram schematically illustrating stages of penetration of the nail into the cell according to an embodiment of the present invention. FIG. 2 illustrates a lithium-ion secondary battery as an example of the test cell 100, a portion of which is shown in cross section. The test cell 100 includes, from its exterior (from an upper side in FIG. 2), a case 110, a packaging film 112, a separator 114, a negative electrode material mixture 122, a negative electrode foil 124, a negative electrode material mixture 126, a separator 128, a positive electrode material mixture 132, a positive electrode foil 134, and a positive electrode material mixture 136 that are sequentially layered on each other. Note that the test cell 100 has a stack of the layered structures each including the foregoing layers from the separator 114 to the positive electrode material mixture 136, the layered structures being repeatedly staked toward an interior of the test cell 100 (toward a lower side in FIG. 2). The negative electrode material mixture 122, the negative electrode foil 124, and the negative electrode material mixture 126 form a negative electrode 120. The positive electrode material mixture 132, the positive electrode foil 134, and the positive electrode material mixture 136 form a positive electrode 130.

FIG. 2 sequentially illustrates, from left to right, a state in which the nail 200 is not yet in contact with the case 110, a state in which the nail 200 has come into contact with the case 110, a state in which the nail 200 has come into contact with the negative electrode foil 124, a state in which the nail 200 has come into contact with the positive electrode material mixture 132, and a state in which the nail 200 has come into contact with the positive electrode foil 134. Nevertheless, in a case of actually causing a nail to penetrate into a cell, the layers in the cell are deformed to become depressed due to compression by the nail. Therefore, it is impossible to determine with which layer the nail has come into contact, simply based on a distance by which the nail has moved.

Figure 3:
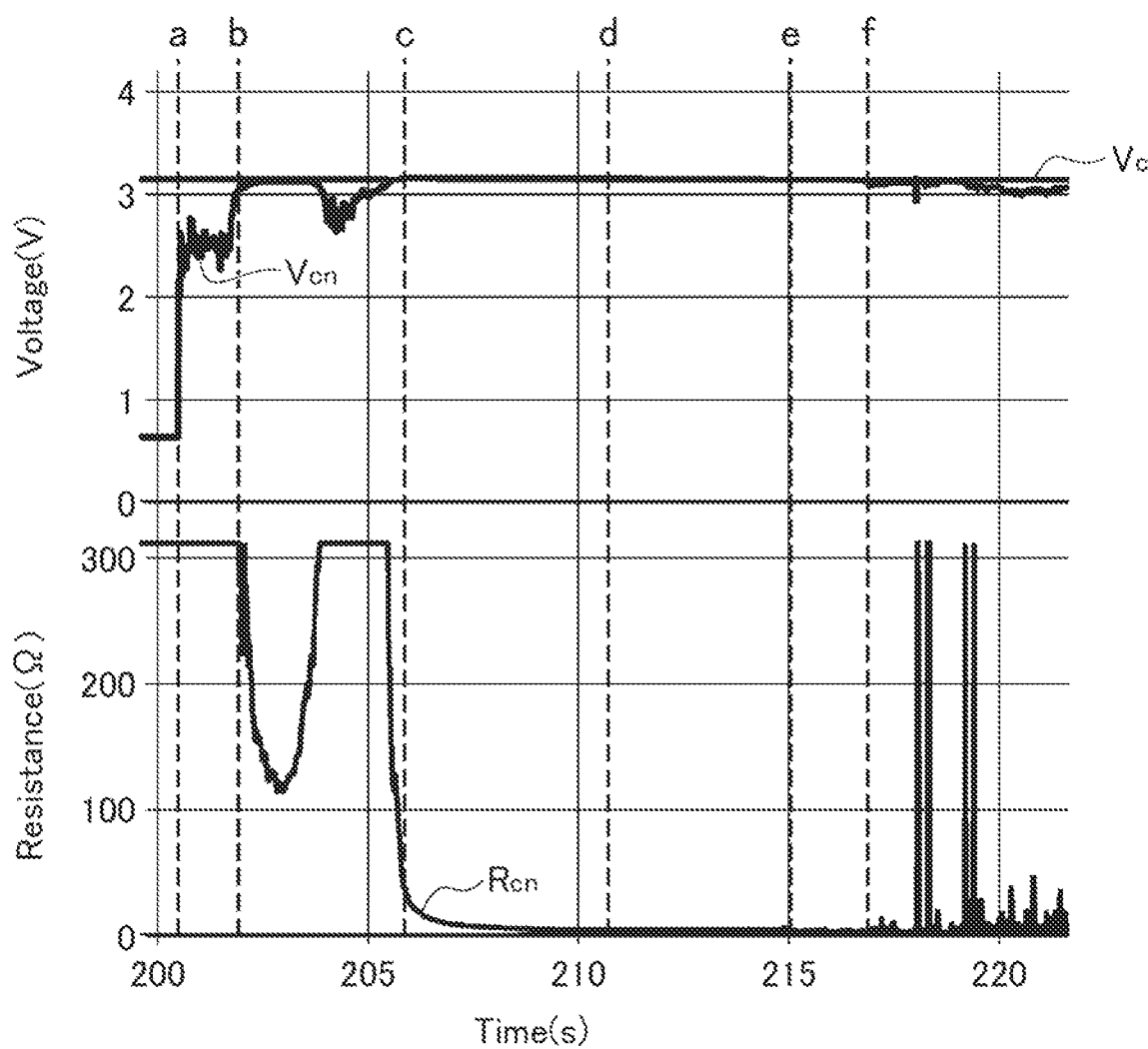
FIG. 3 is a graph showing experimental results according to the present invention.

FIG. 3 is a graph showing experimental results according to the present invention. In the experiment, the positive electrode-nail voltage Vcn, the positive electrode-nail resistance Rcn, a cell voltage (denoted by a reference character "Vc"), and a temperature of the nail 200 were measured while the nail 200 was gradually penetrating into the test cell 100 as illustrated in FIG. 2. The measurement was conducted by way of sampling at intervals of 1 ms. The horizontal axis of FIG. 3 represents time over which the nail 200 was moved. In the direction of the vertical axis, two graphs are vertically arranged. The upper graph plots the measured values of the positive electrode-nail voltage Vcn and the cell voltage Vc, while the lower graph plots the measured values of the positive electrode-nail resistance Rcn.

The nail 200 used in the experiment shown in FIG. 3 is a metal nail having a diameter of 3 mm and a tip angle of 60°. The nail 200 was moved at a speed of 0.01 mm/s. As the test cell 100, a square lithium-ion secondary battery was used. As the measurement device 300, Battery Tester BT3463 manufactured by HIOKI E.E. CORPORATION was used.

Figure 4:
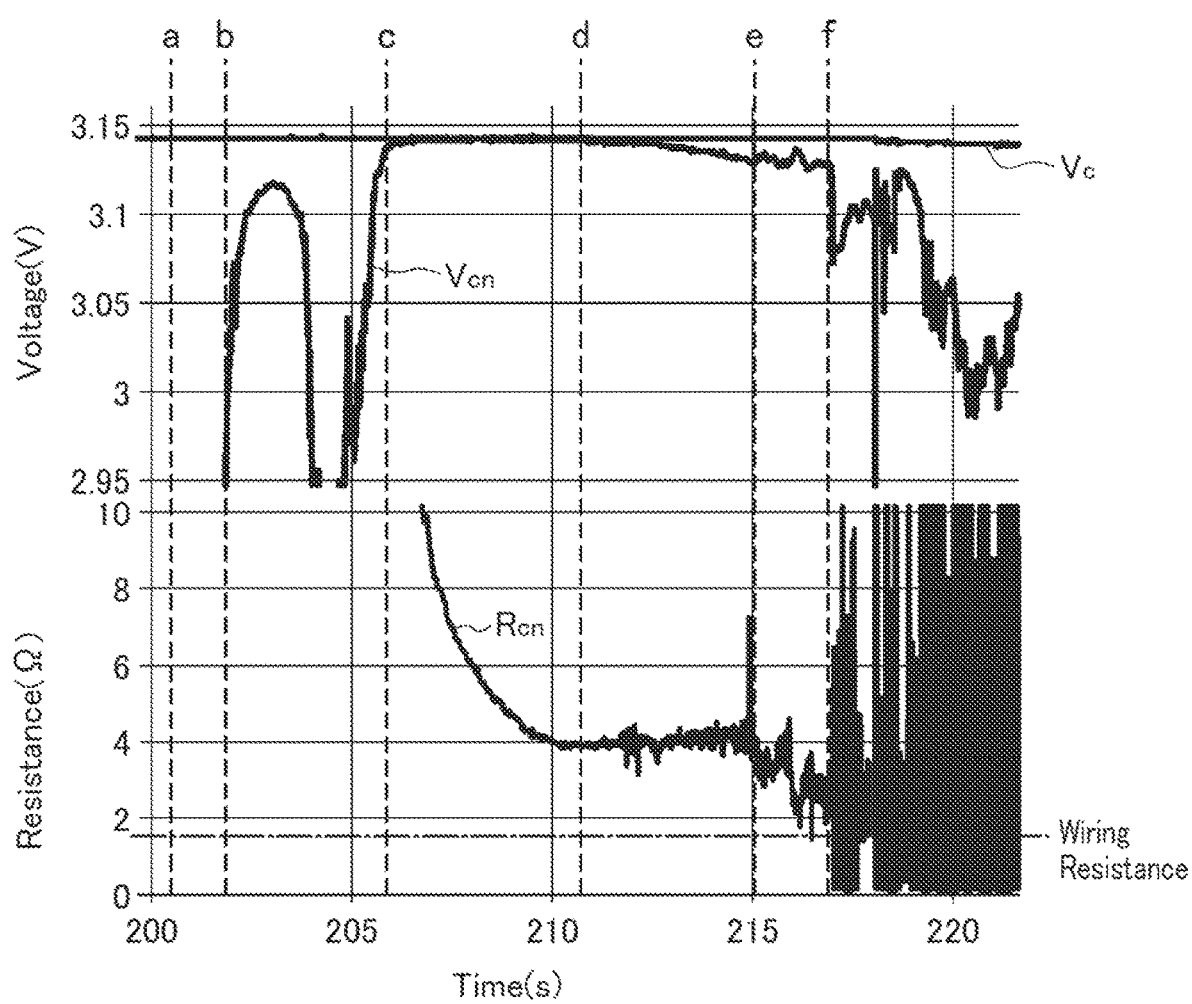
FIG. 4 is a graph showing a portion of the graph of FIG. 3 on an enlarged scale.

FIG. 4 is a graph showing a portion of the graph of FIG. 3 on an enlarged scale. In order that small fluctuations in the positive electrode-nail voltage, those in the positive electrode-nail resistance, and those in the cell voltage can be appreciated, only the scale on the vertical axis is enlarged in FIG. 4, whereas the scale on the horizontal axis of FIG. 4 is the same as that in FIG. 3.

In FIG. 3, the left side relative to a dashed line "a" corresponds to a state in which the nail 200 was moving toward the test cell 100 but not yet in contact with the test cell 100. In this state, the test cell 100 had a cell voltage of 3.14 V, the positive electrode-nail voltage was approximate to zero, and the positive electrode-nail resistance was high enough to exceed the range of the measurement device 300. At the point of time corresponding to the dashed line "a", the nail 200 came into contact with the case 110 of the test cell 100, and the positive electrode-nail voltage increased sharply, so that the graph forms a stepped portion.

Subsequently, the nail 200 penetrated into the test cell 100. At the point of time corresponding to a dashed line "b", the nail 200 came into contact with the negative electrode 120, and the positive electrode-nail voltage increased sharply whereas the positive electrode-nail resistance decreased sharply. On the other hand, during the period from the dashed line "b" to a dashed line "c", the positive electrode-nail voltage and the positive electrode-nail resistance were unstable while significantly fluctuating upward and downward. This would be because although the pointed tip of the nail 200 was in contact with the negative electrode 120, the nail 200 and the negative electrode 120 were not yet in a good contact state (good conduction state).

As shown in FIGS. 3 and 4, during the period from the dashed line "c" to a dashed line "d", the positive electrode-nail voltage was stable and was substantially equal to the cell voltage. On the other hand, the positive electrode-nail resistance sharply decreased again in the vicinity of the dashed line "c", from an overrange value of 310Ω to 20Ω or less at once, and thereafter, was constantly at a low value. This would be because a good contact state (good conduction state) was established between the nail 200 and the negative electrode 120. Based on these phenomena, it can be appreciated that the point of time corresponding to the dashed line "c" is when the nail 200 came into reliable contact with the negative electrode 120 and a good conduction state was established.

It is ideal to determine the point of time corresponding to the dashed line "c" as the point of time at which the nail 200 came into contact with the negative electrode 120. A conceivable method for detecting the contact is as follows. While a voltage value close to the cell voltage is set as a first threshold voltage value V1, the nail 200 is determined to have come into contact with the negative electrode 120 at a moment when the positive electrode-nail voltage exceeds the first threshold voltage value V1. For example, if the cell voltage is 3.14 V, a voltage value close to the cell voltage, i.e., 3.13 V is set as the first threshold voltage value V1. It is determined that at the point of time when the positive electrode-nail voltage exceeds 3.13 V due to the penetration of the nail, the nail 200 has come into contact with the negative electrode 120.

However, the positive electrode-nail voltage significantly fluctuates during the period from the dashed line "b" to the dashed line "c". If the positive electrode-nail voltage exceeds 3.13 V during the fluctuation, a state in which the contact between the nail 200 and the negative electrode 120 is not yet good may be determined to be a contact state of them.

To address this problem, the present inventor has found a method according to which a threshold value is also set with respect to the positive electrode-nail resistance, and a change in the positive electrode-nail resistance is taken into account for the determination, so that a state of contact between the nail and an electrode layer in the test cell can be detected with high accuracy.

Figure 5:
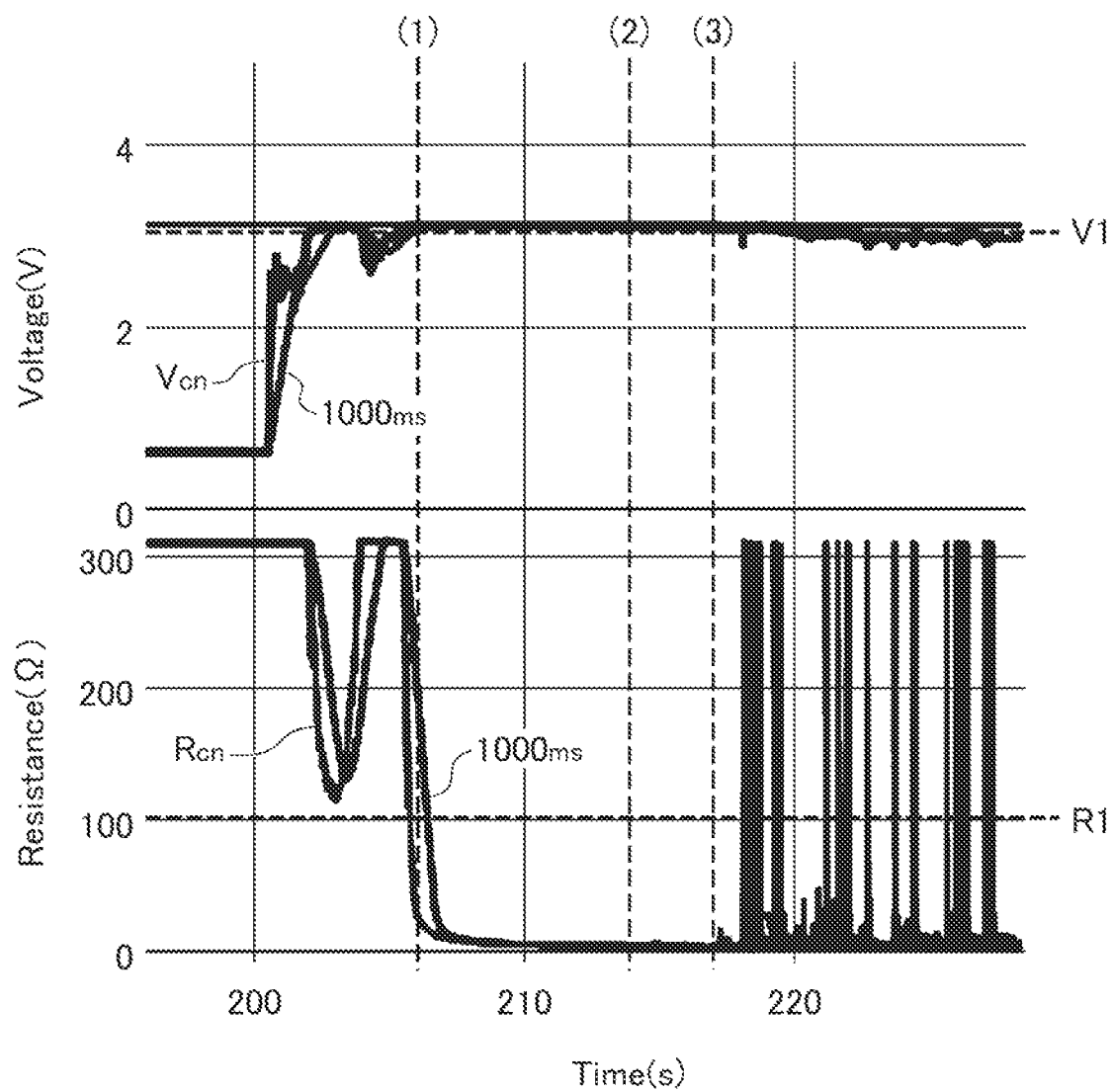
FIG. 5 illustrates threshold values for determination.

FIG. 5 illustrates the threshold values for determination. FIG. 5 shows, in addition to the same measured values (at sampling intervals of 1 ms) as those in FIG. 3, a graph of a 100 ms-moving average and a graph of a 1000 ms-moving average. Since a measured value may include noise, a spike, etc., utilization of the moving averages has been discussed in order to reduce effects of the noise, spike, etc. A dashed line denoted by "V1" indicates the first threshold voltage value V1. The first threshold voltage value V1 is set to a voltage value lower than a cell voltage at an initial stage of the experiment but close to the cell voltage. In this experiment, while the initial cell voltage was 3.14 V, the first threshold voltage value V1 was set to 3.13 V. A dashed line denoted by "R1" indicates a first threshold resistance value R1, which was set to 100Ω.

As described above, at the point of time corresponding to the dashed line "c" in FIG. 3, the positive electrode-nail voltage increased to become approximately equal to the cell voltage, i.e., 3.14 V, whereas the positive electrode-nail resistance sharply decreased, and thereafter, was constantly at a low value. Accordingly, as shown in FIG. 5, the first threshold voltage value V1 was set with respect to the positive electrode-nail voltage, and the first threshold resistance value R1 was also set with respect to the positive electrode-nail resistance. Further, a first determination condition was set as the positive electrode-nail voltage becoming higher than the first threshold voltage value V1 (Vcn>V1) and the positive electrode-nail resistance becoming lower than the first threshold resistance value R1 (Rcn<R1). In this way, at the point of time corresponding to a dashed line (1) in FIG. 5 that is very close to the dashed line "c" in FIG. 3, the nail 200 was determined to have come into contact with the negative electrode 120, and the contact was able to be detected.

The first threshold resistance value R1 is preferably set to such a low value that the positive electrode-nail resistance Rcn cannot reach even if the positive electrode-nail resistance Rcn fluctuates upward and downward during the period from the dashed line "b" to the dashed line "c", and at the same time, is preferably set to a value higher than the value that the positive electrode-nail resistance Rcn reached at the point of time corresponding to the dashed line "c" following its sharp decrease. In FIG. 5, the first threshold resistance value R1 is set to 100Ω, but it may be set to 50Ω. Further, as can be appreciated from the results shown in FIG. 5, this detection (determination) method can be performed based on the measured values (at sampling intervals of 1 ms) of the positive electrode-nail voltage, or based on the 100 ms-moving average or the 1000 ms-moving average. However, when the 1000 ms-moving average is used, the point of time at which the contact between the nail 200 and the negative electrode 120 is detected is slightly delayed.

Based on the research results described above, a first embodiment of the present invention includes: a penetration start step including moving the nail 200 at a predetermined speed and starting penetration of the nail 200 into the test cell 100; a measurement start step including starting measurement of the positive electrode-nail voltage and the positive electrode-nail resistance between the positive electrode terminal 102 of the test cell 100 and the nail 200; and a first determination step including determining that the nail 200 has come into contact with the negative electrode 120 of the test cell 100 when the positive electrode-nail voltage becomes higher than the first threshold voltage value V1 and the positive electrode-nail resistance becomes lower than the first threshold resistance value R1.

This embodiment makes it possible to detect, with high accuracy, the timing at which the nail comes into reliable contact with the negative electrode of the test cell and a good conduction state is established. This embodiment makes it possible to avoid a situation in which a state in which the contact between the nail 200 and the negative electrode 120 is not yet good, as in the time zone from the dashed line "b" to the dashed line "c" in FIG. 3, is determined to be the contact state between the contact between the nail 200 and the negative electrode 120.

Figure 6:
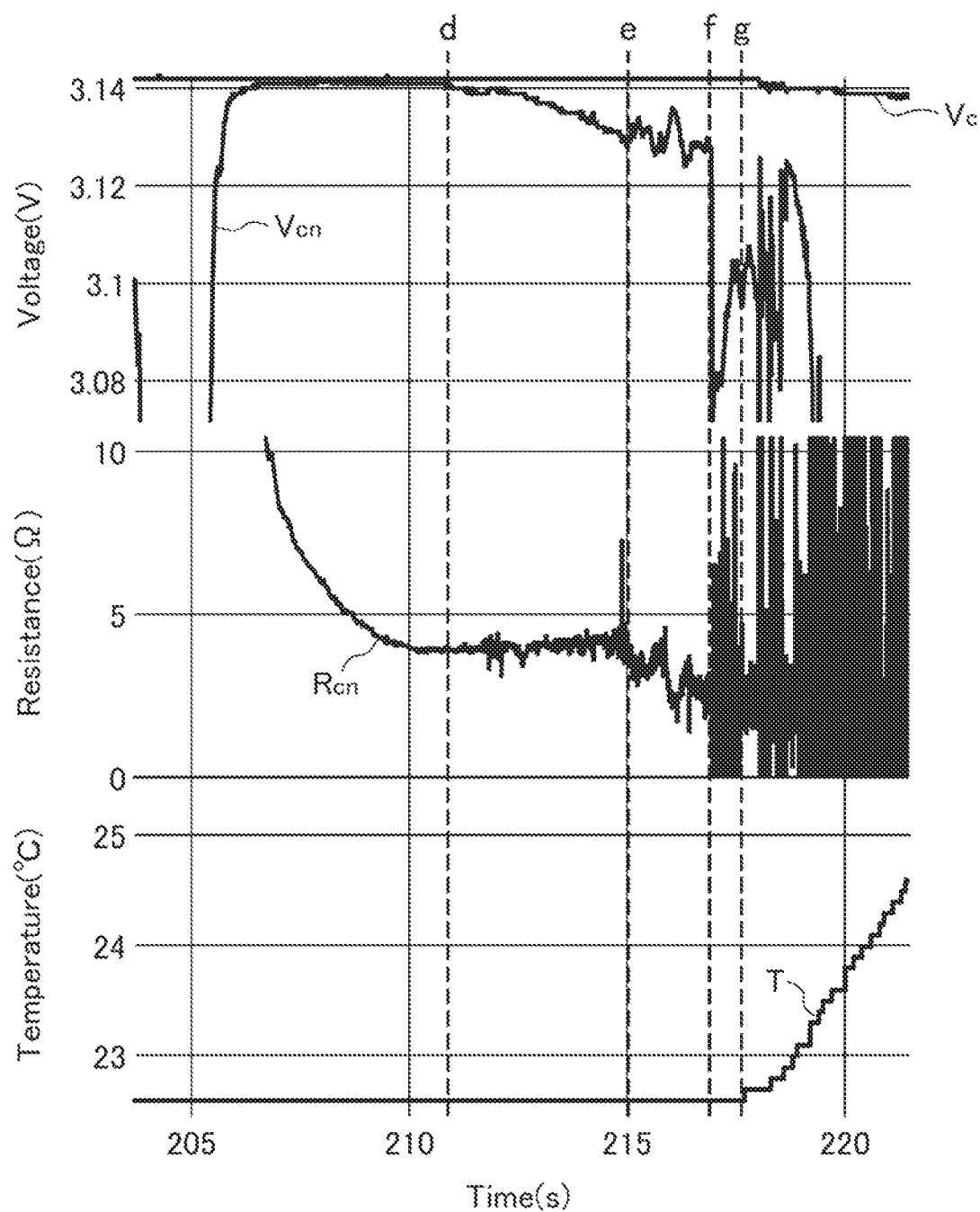
FIG. 6 is a graph showing a portion of the graph of FIG. 4 on an enlarged scale, and additionally showing results of measurement of a temperature of a nail.

FIG. 6 is a graph showing a portion of the graph of FIG. 4 on an enlarged scale, and additionally showing results of measurement of a temperature of the nail. FIG. 6 shows three graphs arranged vertically along the vertical axis. The upper two graphs show a right portion of FIG. 4 on an enlarged scale, whereas the bottom graph plots the measured values of the temperature of the nail 200. From the point of time corresponding to a dashed line "d", the positive electrode-nail voltage Vcn begins to decrease. This would be because the nail 200 comes into contact with the positive electrode material mixture 132, and the negative electrode 120 and the positive electrode 130 begins to short-circuit via the nail 200. On the other hand, the positive electrode-nail resistance Rcn is substantially constantly at a low value during the period from the dashed line "d" to a dashed line "e", and begins to further decrease from the point of time corresponding to the dashed line "e". This would be because the nail 200 comes into contact with the positive electrode foil 134 at the point of time corresponding to the dashed line "e", and the short circuit of the negative electrode 120 and the positive electrode 130 further progresses.

As the time passes further, the positive electrode-nail resistance Rcn begins to oscillate from the point of time corresponding to a dashed line "f". This would be because the positive electrode foil 134 begins to be fused. From the point of time corresponding to a dashed line "g", the cell voltage Vc begins to decrease, and the temperature of the nail 200 begins to increase. This indicates that the short circuit of the negative electrode 120 and the positive electrode 130 has progressed to a considerable extent. Through analysis and studies on these experimental results, the present inventor has found a method that enables further accurate detection of a contact state of a nail and a positive electrode of a test cell, by way of additionally setting a threshold value with respect to a positive electrode-nail resistance and making determination while additionally taking account of a change in the positive electrode-nail resistance.

Figure 7:
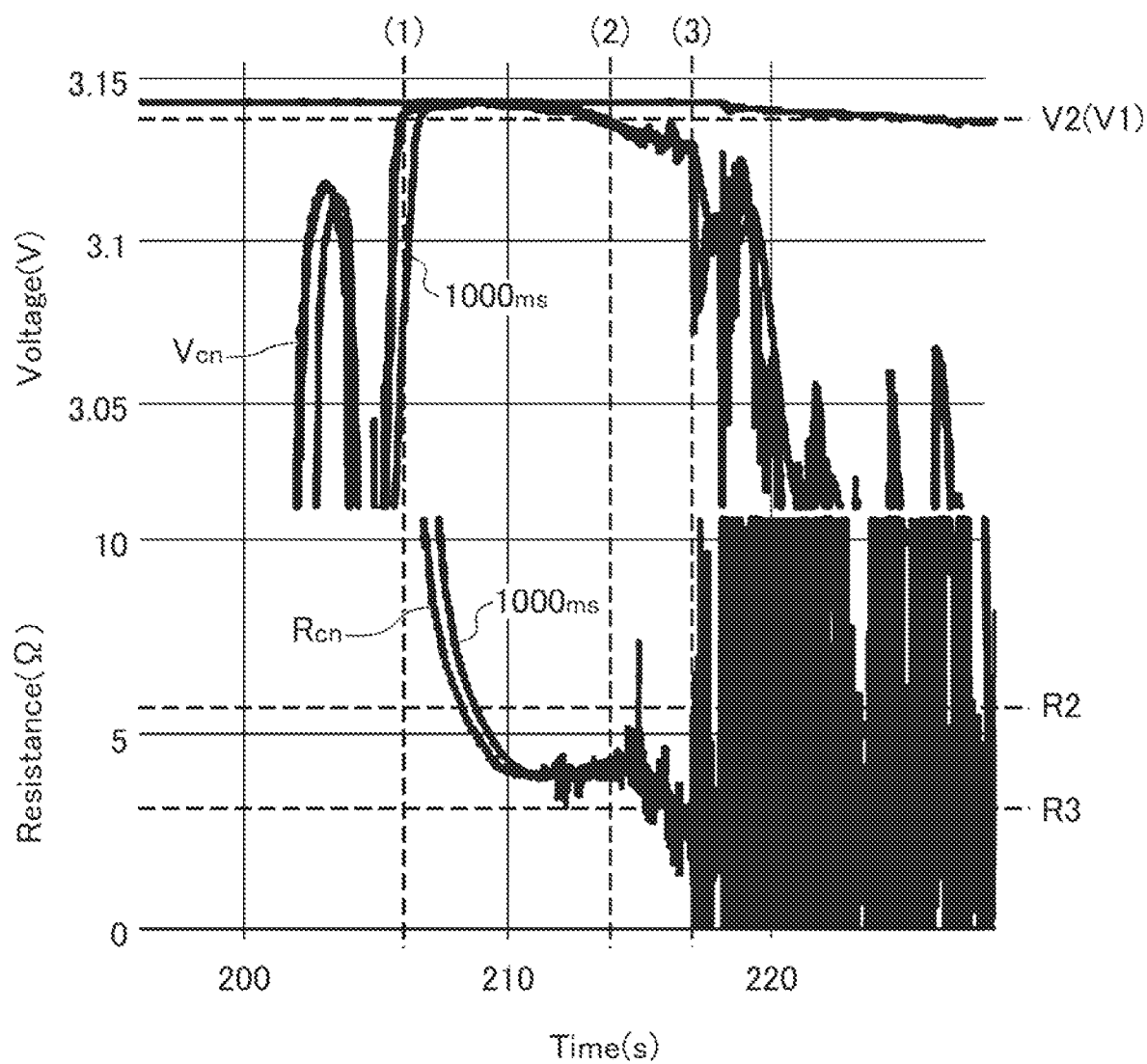
FIG. 7 illustrates threshold values for determination.

FIG. 7 illustrates the threshold values for determination. FIG. 7 shows, in addition to the same measured values (at sampling intervals of 1 ms) as those in FIG. 6, a graph of a 100 ms-moving average and a graph of a 1000 ms-moving average. A dashed line denoted by "V2" indicates a second threshold voltage value V2. The second threshold voltage value V2 is set to a voltage value lower than a cell voltage at an initial stage of the experiment but close to the cell voltage. In this experiment, while the initial cell voltage was 3.14 V, the second threshold voltage value V2 was set to 3.13 V, which is equal to the first threshold voltage value V1.

A dashed line denoted by "R2" indicates a second threshold resistance value R2. The second threshold resistance value R2 is set for the purpose of detecting a state in which the nail 200 comes into contact with the positive electrode material mixture 132. The second threshold resistance value R2 is preferably set to a value slightly higher than the positive electrode-nail resistance Rcn in the period from the dashed line "d" to the dashed line "e" in FIG. 6. In this experiment, the second threshold resistance value R2 was set to 6Ω. A dashed line denoted by "R3" indicates a third threshold resistance value R3. The third threshold resistance value R3 is set for the purpose of detecting a state in which the nail 200 comes into contact with the positive electrode foil 134. The third threshold resistance value R3 is preferably set to a value slightly lower than the positive electrode-nail resistance Rcn in the period from the dashed line "d" to the dashed line "e" in FIG. 6. In this experiment, the third threshold resistance value R3 was set to 3Ω.

A second determination condition was set as the positive electrode-nail voltage becoming lower than the second threshold voltage value V2 (VCn<V2) and the positive electrode-nail resistance becoming lower than the second threshold resistance value R2 and higher than the third threshold resistance value R3 (R3<Rcn<R2). In this way, at the position corresponding to a dashed line (2) in FIG. 7, the nail 200 was determined to have come into contact with the positive electrode material mixture 132, and the contact was able to be detected.

Note that a third determination condition was set as the positive electrode-nail voltage becoming lower than the second threshold voltage value V2 (Vcn<V2) and the positive electrode-nail resistance becoming lower than the third threshold resistance value R3 (Rcn<R3). In this way, at the position corresponding to a dashed line (3) in FIG. 7, the nail 200 was determined to have come into contact with the positive electrode foil 134, and the contact was able to be detected. As can be appreciated from the results shown in FIG. 7, this detection (determination) method can be performed based on the measured values (at sampling intervals of 1 ns) of the positive electrode-nail voltage and the positive electrode-nail resistance, or based on the 100 ms-moving average or the 1000 ms-moving average.

Based on the research results described above, a second embodiment of the present invention, which is a modification of the first embodiment, includes: after the first determination step, a second determination step including determining that the nail 200 has come into contact with the positive electrode material mixture 132 of the test cell 100 when the positive electrode-nail voltage becomes lower than the second threshold voltage value V2 and the positive electrode-nail resistance becomes lower than the second threshold resistance value R2 and higher than the third threshold resistance value R3; and a third determination step including determining that the nail 200 has come into contact with the positive electrode foil 134 of the test cell 100 when the positive electrode-nail voltage becomes lower than the second threshold voltage value V2 and the positive electrode-nail resistance becomes lower than the third threshold resistance value R3.

This embodiment makes it possible to detect not only a state in which the nail has come into contact with the positive electrode of the test cell, but also further details of the contact, i.e., whether the nail is in contact with the positive electrode material mixture or the positive electrode foil. Thus, this embodiment enables highly accurate control of a position at which the nail is stopped.

Based on the research results described above, a third embodiment of the present invention, which is a modification of the first embodiment, includes: after the first determination step, a third determination step including determining that the nail 200 has come into contact with the positive electrode foil 134 of the test cell 100 when the positive electrode-nail voltage becomes lower than the second threshold voltage value V2 and the positive electrode-nail resistance becomes lower than the third threshold resistance value R3.

This embodiment makes it possible to highly accurately detect a timing at which the nail has come into contact with the positive electrode foil.

The second determination step or the third determination step may be followed by a stop step including stopping penetration of the nail 200. The stop step makes the nail 200 immovable at a position that the nail 200 has reached by penetration, so that the safety of the test cell 100 can be evaluated by way of, for example, measurement of the temperature, the cell voltage, etc. of the test cell 100 and by way of observation of whether smoke is generated. Thereafter, a measurement stop step may be performed to stop the related measurement. Further, as in the experiment described above, the second threshold voltage value V2 may be set equal to the first threshold voltage value V1.

Figure 8:
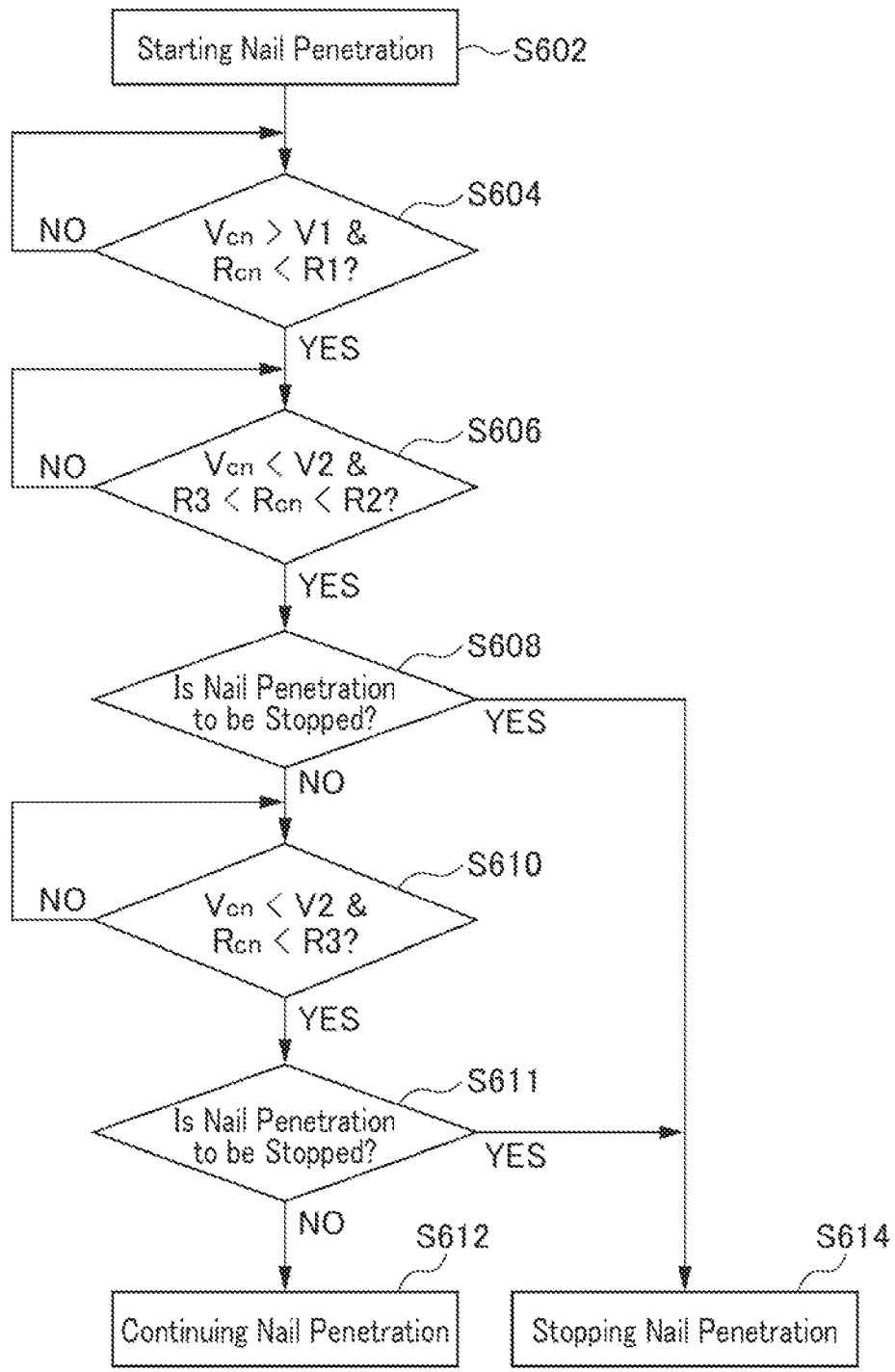
FIG. 8 is a flowchart illustrating an embodiment of the present invention.

FIG. 8 is a flowchart illustrating an embodiment of the present invention. This flowchart illustrates an example of the second embodiment. In a penetration start step S602, the nail 200 is moved at a predetermined speed to start penetrating into the test cell 100. Note that, along with this step, measurement of the positive electrode-nail voltage Vcn and the positive electrode-nail resistance Rcn between the positive electrode terminal 102 of the test cell 100 and the nail 200 may be started. The measurement does not have to be started at the same time as the penetration start step S602, but is preferably started before the nail 200 contacts with the test cell 100.

In a first determination step S604, it is determined whether the positive electrode-nail voltage has become higher than the first threshold voltage value V1 (Vcn>V1)

and the positive electrode-nail resistance has become lower than the first threshold resistance value R1 (Rcn<R1). If this condition is not satisfied, the first determination step S604 is repeated. When the condition that Vcn>V1 and Rcn<R1 is satisfied, it is determined that the nail 200 has come into contact with the negative electrode 120 of the test cell 100, and the process proceeds to the next step, i.e., a second determination step.

In the second determination step S606, it is determined whether the positive electrode-nail voltage has become lower than the second threshold voltage value V2 (Vcn<V2) and the positive electrode-nail resistance becomes lower than the second threshold resistance value R2 and higher than the third threshold resistance value R3 (R3<Rcn<R2). If this condition is not satisfied, the second determination step S606 is repeated. When the condition that Vcn<V2 and R3<Rcn<R2 is satisfied, it is determined that the nail 200 has come into contact with the positive electrode material mixture 132 of the test cell 100, and the process proceeds to the next step.

In a penetration stop determination step S608, it is checked whether the safety of the cell is to be evaluated in a state where the negative electrode 120 and the positive electrode mixture 132 have short-circuited. If so, the process proceeds to a penetration stop step S614, whereby the penetration of the nail 200 is stopped. Otherwise, the process proceeds to a third determination step S610.

In the third determination step S610, it is determined whether the positive electrode-nail voltage has become lower than the second threshold voltage value V2 (Vcn<V2) and the positive electrode-nail resistance has become lower than the third threshold resistance value R3 (Rcn<R3). If this condition is not satisfied, the third determination step S610 is repeated. When the condition that Vcn<V2 and Rcn<R3 is satisfied, it is determined that the nail 200 has come into contact with the positive electrode foil 134 of the test cell 100, and the process proceeds to the next step.

In a penetration stop determination step S611, it is checked whether the safety of the cell is to be evaluated in a state where the negative electrode 120 and the positive electrode foil 134 have short-circuited. If so, the process proceeds to a penetration stop step S614, whereby the penetration of the nail 200 is stopped. Otherwise, the process proceeds to a penetration continuation step S612, whereby the nail penetration is continued.

This embodiment makes it possible to determine and detect, with high accuracy, each of the state in which the nail has come into contact with the negative electrode, the state in which the nail has come into contact with the positive electrode material mixture, and the state in which the nail has come into contact with the positive electrode foil. Thus, the cell can be evaluated while the nail is stopped and remains in one state of interest as needed.

Figure 9:
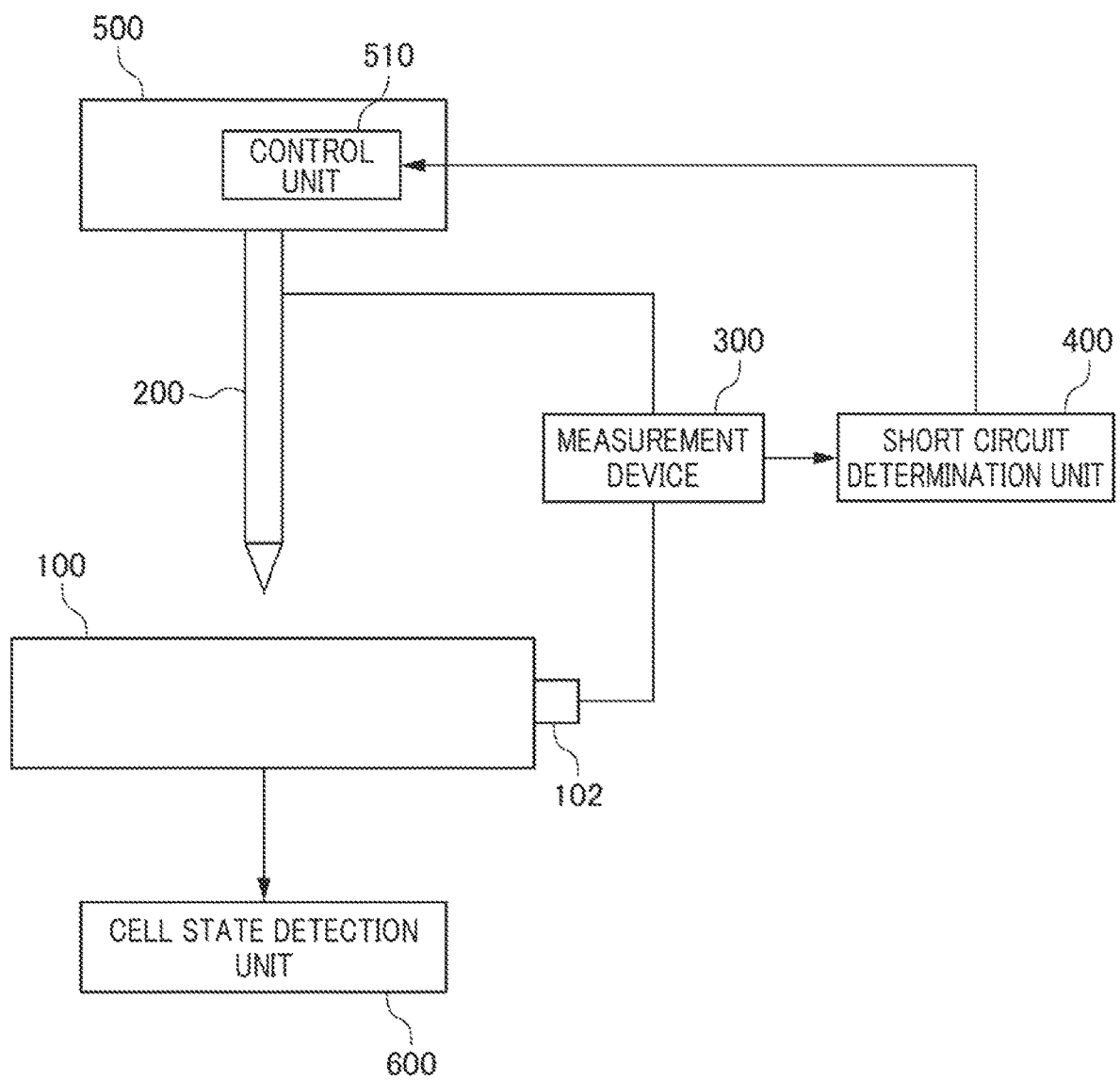
FIG. 9 is a block diagram illustrating a cell evaluation device according to an embodiment of the present invention.

FIG. 9 is a block diagram illustrating a cell evaluation device according to an embodiment of the present invention. The cell evaluation device can be used directly to implement the above-described cell evaluation method of the present invention. The cell evaluation device includes the nail 200, a measurement device 300, a short circuit determination unit 400, a drive device 500, and a cell state detection unit 600.

The drive device 500 moves the nail 200 at a predetermined speed, and causes the nail 200 to penetrate into the test cell 100. The drive device 500 may be, for example, a pressurization device. For example, it is possible that the nail 200 is attached to, and driven by, the pressurization device so that the nail 200 is moved at the predetermined speed to the test cell 100 and is caused to penetrate into the test cell 100.

The measurement device 300 measures the voltage Vcn between the positive electrode terminal 102 of the test cell 100 and the nail 200 and the AC electric resistance Rcn between the positive electrode terminal 102 and the nail 200 in a state where the test cell 100 has the nail 200 penetrating thereinto. The measurement device 300 then outputs the measurement results to the short circuit determination unit 400.

The short circuit determination unit 400 determines a state of a short circuit of the test cell 100, based on the measurement results from the measurement device 300. The first threshold voltage value V1, the second threshold voltage value V2, the first threshold resistance value R1, the second threshold resistance value R2, and the third threshold resistance value R3 have been inputted into the short circuit determination unit 400 in advance. When the positive electrode-nail voltage Vcn becomes higher than the first threshold voltage value V1 (Vcn>V1) and the positive electrode-nail resistance Rcn becomes lower than the first threshold resistance value R1 (Rcn<R1), the short circuit determination unit 400 determines that the nail 200 has come into contact with the negative electrode 120 of the test cell 100.

After determining that the nail 200 has come into contact with the negative electrode 120 of the test cell 100, when the positive electrode-nail voltage Vcn becomes lower than the second threshold voltage value V2 (Vcn<V2) and the positive electrode-nail resistance Rcn becomes lower than the second threshold resistance value R2 and higher than the third threshold resistance value R3 (R3<Rcn<R2), the short circuit determination unit 400 determines that the nail 200 has come into contact with the positive electrode material mixture 132 of the test cell 100. Further, when the positive electrode-nail voltage Vcn becomes lower than the second threshold voltage value V2 (Vcn<V2) and the positive electrode-nail resistance Rcn becomes lower than the third threshold resistance value R3 (Rcn<R3), the short circuit determination unit 400 determines that the nail 200 has come into contact with the positive electrode foil 134 of the test cell 100. The short circuit determination unit 400 outputs the determination results to a control unit 510 of the drive device 500. The second threshold voltage value V2 may be equal to, or different from, the first threshold voltage value V1.

The control unit 510 of the drive device 500 controls the drive device 500 based on the determination results from the short circuit determination unit 400 and preset control conditions. For example, the control condition can be set whereby upon contact of the nail 200 with the positive electrode material mixture 132 of the test cell 100, the penetration of the nail 200 is stopped and the cell is evaluated. In this case, upon receiving a determination result that the nail 200 has come into contact with the positive electrode material mixture 132 from the short circuit determination unit 400, the control unit 510 controls the drive device 500 to stop the penetration of the nail 200. The control condition can be set whereby upon contact of the nail 200 with the positive electrode foil 134 of the test cell 100, the penetration of the nail 200 is stopped and the cell is evaluated. In this case, the control unit 510 allows the penetration of the nail 200 to continue even when a determination result that the nail 200 has come into contact with the positive electrode material mixture 132 is received from the short circuit determination unit 400, and controls the control device 500 to stop the penetration of the nail 200 only when a determination result that the nail 200 has come into contact with the positive electrode foil 134 is received from the short circuit determination unit 400.

The cell state detection unit 600 may be a measurement device that can measure and record a cell temperature, a cell internal pressure, a cell pressure, etc. of the test cell 100 by means of various sensors, such as a thermocouple. Alternatively, the cell state detection unit 600 may be a camera or the like that can observe and record the generation of smoke, ignition, etc. Note that the cell state detection unit 600 may include two or more devices, such as measurement devices having different functions, a camera, and the like. The cell state detection unit 600 is capable of detecting a change in a state of the test cell 100 in which an internal short circuit has been caused by the nail penetration. The safety of the cell can be evaluated based on the detection results obtained in this way.

The cell evaluation device of the present invention is capable of detecting, with high accuracy, each of the state in which the nail has come into contact with the negative electrode, the state in which the nail has come into contact with the positive electrode material mixture, and the state in which the nail has come into contact with the positive electrode foil. This feature makes it possible to evaluate the cell while the nail is stopped and remains in one state of interest as needed.

In the foregoing, the present invention has been described by way of some embodiments. However, the technical scope of the present invention is not limited to the scope described in the above embodiments. Those skilled in the art will appreciate that various modifications or improvements may be made to the embodiments described above. It is also evident from the claims that the embodiments with such modifications or improvements can be encompassed in the technical scope of the present invention. Not all the combinations of the features described in the above embodiments are essential to the means to achieve the object of the invention.

It should be noted that processes (e.g., operations, procedures, steps, and stages) of the device(s)/apparatus(es), system(s), program(s), and method(s) disclosed in the claims, the specification, and the drawings may be carried out in any order unless it is specifically stated that "before", "prior to", and the like, and unless an output of a process is used in a subsequent process. With respect to the operation procedure(s) disclosed in the claims, the specification, and the drawings, even if "first", "next", and similar words are used for the sake of convenience, such words are not intended to mean that it is essential to carry out the operations or processes in the order interpretable from the words.

EXPLANATION OF REFERENCE NUMERALS

100: Test Cell
102: Positive Electrode Terminal
104: Negative Electrode Terminal
110: Case
112: Packaging Film
114: Separator
120: Negative Electrode
122: Negative Electrode Material Mixture
124: Negative Electrode Foil
126: Negative Electrode Material Mixture
128: Separator
132: Positive Electrode Material Mixture
134: Positive Electrode Foil
136: Positive Electrode Material Mixture
200: Nail
300: Measurement Device
400: Short Circuit Determination Unit
500: Drive Device
510: Control Unit
600: Cell State Detection Unit

The invention claimed is:

1. A cell evaluation method for evaluating safety of a cell, the cell evaluation method including forcibly causing an internal short circuit in a test cell by way of penetration of a metal projection into the test cell, and detecting a change occurring in a state of the test cell due to the internal short circuit, the cell evaluation method comprising:
   a penetration start step including moving the metal projection at a predetermined speed and starting penetration of the metal projection into the test cell;
   a measurement start step including starting measurement of a voltage and electric resistance between a positive electrode terminal of the test cell and the metal projection;
   a first determination step including determining that the metal projection has come into contact with a negative electrode of the test cell when the voltage becomes higher than a first threshold voltage value V1 and the resistance becomes lower than a first threshold resistance value R1;
   after the first determination step,
   a second determination step including determining that the metal projection has come into contact with a positive electrode material mixture of the test cell when the voltage becomes lower than a second threshold voltage value V2 and the resistance becomes lower than a second threshold resistance value R2 and higher than a third threshold resistance value R3; and,
   a third determination step including determining that the metal projection has come into contact with a positive electrode foil of the test cell when the voltage becomes lower than the second threshold voltage value V2 and the resistance becomes lower than the third threshold resistance value R3.

2. The cell evaluation method according to claim 1, further comprising:
   after the second or third determination step, a penetration stop step including stopping the penetration of the metal projection.

3. The cell evaluation method according to claim 2 further comprising:
   a measurement stop step including stopping the measurement.

4. The cell evaluation method according to claim 1, wherein the second threshold voltage value V2 is equal to the first threshold voltage value V1.

5. A cell evaluation method for evaluating safety of a cell, the cell evaluation method including forcibly causing an internal short circuit in a test cell by way of penetration of a metal projection into the test cell, and detecting a change occurring in a state of the test cell due to the internal short circuit, the cell evaluation method comprising:
   a penetration start step including moving the metal projection at a predetermined speed and starting penetration of the metal projection into the test cell;
   a measurement start step including starting measurement of a voltage and electric resistance between a positive electrode terminal of the test cell and the metal projection;
   a first determination step including determining that the metal projection has come into contact with a negative electrode of the test cell when the voltage becomes higher than a first threshold voltage value V1 and the resistance becomes lower than a first threshold resistance value R1; and after the first determination step, a third determination step including determining that the metal projection has come into contact with a positive electrode foil of the test cell when the voltage becomes lower than a second threshold voltage value V2 and the resistance becomes lower than a third threshold resistance value R3.

6. A cell evaluation device for evaluating safety of a cell by forcibly causing an internal short circuit in a test cell by way of penetration of a metal projection into the test cell, and by detecting a change occurring in a state of the test cell due to the internal short circuit, the cell evaluation device comprising:

a drive device that moves the metal projection at a predetermined speed, and causes the metal projection to penetrate into the test cell;

a measurement device that measures a voltage and electric resistance between a positive electrode terminal of the test cell and the metal projection; and a short circuit determination unit that determines that the metal projection has come into contact with a negative electrode of the test cell when the voltage becomes higher than a first threshold voltage value V1 and the resistance becomes lower than a first threshold resistance value R1, wherein after determining that the metal projection has come into contact with the negative electrode of the test cell, the short circuit determination unit determines that the metal projection has come into contact with a positive electrode material mixture of the test cell when the voltage becomes lower than a second threshold voltage value V2 and the resistance becomes lower than a second threshold resistance value R2 and higher than a third threshold resistance value R3, and the short circuit determination unit determines that the metal projection has come the short circuit determination unit determines that the metal projection has come into contact with a positive electrode foil of the test cell when the voltage becomes lower than the second threshold voltage value V2 and the resistance becomes lower than the third threshold resistance value R3.

7. The cell evaluation device according to claim 6, wherein when the short circuit determination unit determines that the metal projection has come into contact with the positive electrode material mixture of the test cell or that the metal projection has come into contact with the positive electrode foil of the test cell, the drive device stops the penetration of the metal projection.

8. The cell evaluation device according to claim 6, wherein the second threshold voltage value V2 is equal to the first threshold voltage value V1.

* * * * *